(12) United States Patent
Scott et al.

(10) Patent No.: US 10,473,518 B2
(45) Date of Patent: Nov. 12, 2019

(54) SENSING APPARATUS HAVING A LIGHT SENSITIVE DETECTOR FIELD

(71) Applicant: STMICROELECTRONICS (RESEARCH & DEVELOPMENT) LIMITED, Marlow (GB)

(72) Inventors: Iain Scott, Edinburgh (GB); Sam Lee, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 67 days.

(21) Appl. No.: 15/894,375

(22) Filed: Feb. 12, 2018

(65) Prior Publication Data
US 2018/0164152 A1 Jun. 14, 2018

Related U.S. Application Data

(63) Continuation of application No. 15/051,833, filed on Feb. 24, 2016, now Pat. No. 9,939,316.

(30) Foreign Application Priority Data
Sep. 30, 2015 (GB) .................. 1517267.9

(51) Int. Cl.
| | |
|---|---|
| *G01J 1/02* | (2006.01) |
| *G01J 1/44* | (2006.01) |
| *H01L 31/02* | (2006.01) |
| *G01C 3/08* | (2006.01) |
| *H01L 31/107* | (2006.01) |

(Continued)

(52) U.S. Cl.
CPC .............. *G01J 1/0266* (2013.01); *G01C 3/08* (2013.01); *G01J 1/44* (2013.01); *G01S 7/4863* (2013.01); *G01S 7/4865* (2013.01); *G01S 7/497* (2013.01); *G01S 17/89* (2013.01); *H01L 31/02027* (2013.01); *H01L 31/107* (2013.01); *G01J 2001/4466* (2013.01)

(58) Field of Classification Search
CPC .... G01J 1/0266; G01J 1/44; G01J 2001/4466; G01S 17/89; G01S 7/497; G01S 7/4865; G01S 7/4863; G01C 3/08; H01L 31/02027; H01L 31/107
USPC ...................................... 250/214.1
See application file for complete search history.

(56) References Cited

U.S. PATENT DOCUMENTS

| | | |
|---|---|---|
| 5,095,453 A | 3/1992 | Pierson et al. |
| 5,672,289 A | 9/1997 | O'Neill |

(Continued)

FOREIGN PATENT DOCUMENTS

| | | |
|---|---|---|
| EP | 0745868 | 12/1996 |
| EP | 1006591 | 6/2000 |

(Continued)

*Primary Examiner* — Seung C Sohn
(74) *Attorney, Agent, or Firm* — Slater Matsil, LLP

(57) ABSTRACT

A sensing apparatus includes a sensor and a processor. The sensor includes at least one light sensitive detector. The processor determines a first control value to control a voltage differential across the at least one light sensitive detector, and compares the first control value with a reference value associated with a reference temperature. Based on the comparison, the processor provides adjustment information for adjusting at least one output of the sensing apparatus, and an operating parameter of the sensing apparatus other than the voltage differential.

21 Claims, 10 Drawing Sheets

(51) Int. Cl.
*G01S 17/89* (2006.01)
*G01S 7/486* (2006.01)
*G01S 7/497* (2006.01)

(56) References Cited

U.S. PATENT DOCUMENTS

| | | | |
|---|---|---|---|
| 9,190,552 B2 * | 11/2015 | Brunel | H01L 31/02016 |
| 2001/0045510 A1 | 11/2001 | Ganghofer | |
| 2014/0231630 A1 * | 8/2014 | Rae | G01S 17/10 250/214.1 |

FOREIGN PATENT DOCUMENTS

| | | |
|---|---|---|
| GB | 2510890 | 8/2014 |
| WO | 2014118537 | 8/2014 |

* cited by examiner

SENSING APPARATUS HAVING A LIGHT SENSITIVE DETECTOR FIELD

CROSS-REFERENCE TO RELATED APPLICATIONS

This application is a continuation of U.S. application Ser. No. 15/051,833, filed on Feb. 24, 2016, which claims priority to United Kingdom Patent Application No. 1517267.9, filed on Sep. 30, 2015, both of which applications are hereby incorporated herein by reference.

TECHNICAL FIELD

The present invention relates to a method and apparatus, and in particular, but not exclusively, to a sensing apparatus having a light sensitive detector.

BACKGROUND

A single photon avalanche detector (SPAD) is based on a p-n junction device biased beyond its breakdown region. A high reverse bias voltage generates a sufficiently large electric field such that a single charge carrier introduced into a depletion layer of the p-n junction device can cause a self-sustaining avalanche. The charge carrier may be released by the impact of a photon (impact ionization). The SPAD may be quenched, allowing the device to be reset to detect further photons. The behavior of the SPAD may vary depending on one or more factors such as temperature, aging and process variation.

SUMMARY

In one embodiment, a sensing apparatus comprises a sensor comprising at least one light sensitive detector and a processor. The processor may be configured to determine a first control value which is used to control a voltage differential across the at least one detector, and compare the first control value with a reference value associated with a reference temperature. Based on the comparison, the processor may be configured to provide adjustment information for adjusting one or more outputs of the sensing apparatus, and an operating parameter different than the voltage differential, of the sensing apparatus.

The adjustment information may be dependent on the magnitude of the difference between the first control value and the reference value, and whether the first control value is greater or less than the reference value.

For a given magnitude of difference, a magnitude associated with the adjustment information may be different depending on whether the first control value is greater or less than the reference value.

For the given magnitude of difference the adjustment information may represent a bigger adjustment if the difference between the first control value and the reference value is indicative that temperature is greater than the reference temperature as compared to when the difference between the first control value and the reference value is indicative that temperature is less than the reference temperature.

The operating parameter may comprise an oscillator frequency. The oscillator frequency may be a clock signal frequency.

The adjustment information may be configured to adjust the clock signal frequency such that the clock signal frequency is within a given frequency range such that one or more of harmonics of the clock signal, the clock signal frequency, one or more signals derived from the clock signal, and harmonics of one or more signals derived from the clock signal are outside one or more communication band frequencies. The adjustment information may comprise trim information for trimming the oscillator frequency.

The sensing apparatus may be configured to determine a distance of an object away from the apparatus, with the output of the sensing apparatus being the distance.

The sensing apparatus may comprise an array of light sensitive detectors. At least one light sensitive detector may comprise a SPAD.

Another aspect is directed to a sensing method comprising determining a first control value which is used to control a voltage differential across at least one light sensitive detector, and comparing the first control value with a reference value associated with a reference temperature, Based on the comparison adjustment information may be provided for adjusting one or more of an output of a sensing apparatus in which the at least one light sensitive detector is provided, and an operating parameter different than the voltage differential, of the sensing apparatus. The method may further comprise adjusting one or more of the outputs and the operating parameter using the adjustment information.

The adjustment information may be dependent on the magnitude of the difference between the first control value and the reference value, and whether the first control value is greater or less than the reference value.

For a given magnitude of difference, a magnitude associated with the adjustment information may be different depending on whether the first control value is greater or less than the reference value.

For the given magnitude of difference the adjustment information may represent a bigger adjustment if the difference between the first control value and the reference value is indicative that temperature is greater than the reference temperature as compared to when the difference between the first control value and the reference value is indicative that temperature is less than the reference temperature.

The operating parameter may comprise an oscillator frequency. The oscillator frequency may be a clock signal frequency.

The adjustment information may be configured to adjust the clock signal frequency such that the clock signal frequency is within a given frequency range such that one or more of harmonics of the clock signal, the clock signal frequency, one or more signals derived from the clock signal, and harmonics of one or more signals derived from the clock signal are outside one or more communication band frequencies.

The adjustment information may comprise trim information for trimming the oscillator frequency, and the method may comprise trimming the oscillator frequency using the trim information. The method may comprise determining a distance of an object away from the apparatus, with the output being the distance which is adjusted.

BRIEF DESCRIPTION OF THE DRAWINGS

Reference will now be made, by way of example only, to the accompanying drawings in which.

DETAILED DESCRIPTION OF ILLUSTRATIVE EMBODIMENTS

Single-photon avalanche diodes (SPAD), are also called Geiger mode avalanche photo diodes (GAPD). These devices have a reverse biased p-n junction in which a photo-generated carrier can trigger an avalanche current due to an impact ionization mechanism. SPADs may be designed to operate with a reverse bias voltage well above the breakdown voltage.

Figure 1:
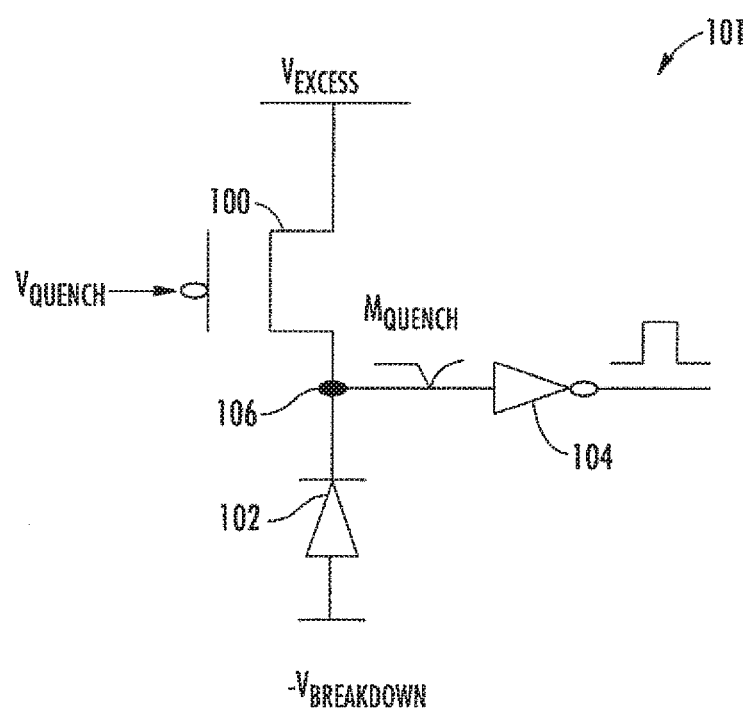
FIG. 1 is a diagram of a SPAD with a quench and readout circuit.

FIG. 1 schematically shows a single photon avalanche diode (SPAD) 101. The SPAD 101 has a reverse biased p-n junction 102. The reverse biased p-n junction 102 has a high reverse bias voltage ($-V_{BREAKDOWN}$). With the reverse bias voltage, a relatively high electric field is generated such that a single charge carrier injected into the depletion layer triggers a self-sustaining avalanche via impact ionization. In other words, a photon impacting on the reverse biased p-n junction device 102 releases a single charge which triggers a chain reaction releasing a large number of electrons leading to a large current.

To reset the device 102, the current flow is quenched. Without quenching, the p-n junction device 102 may be permanently damaged.

Different types of quenching are known. For example, passive or active quenching may be used. Passive quenching may, for example, use a resistor in series with the SPAD. The avalanche current is effectively quenched as a voltage drop is developed across a relatively high value resistance of the resistor. Alternatively, active quenching may be used.

FIG. 1 shows an example where passive quenching is used. A p-type MOSFET (metal-oxide-semiconductor field-effect transistor) 100 is provided in series with the p-n junction device 102 and is connected between the more positive voltage $V_{EXCESS}$ and the reverse biased p-n junction device 102. A quenching voltage $V_{QUENCH}$ is applied to the gate of the MOSFET 100. The MOSFET 100 acts as a relatively high resistance resistor.

The voltage waveform at the node 106 between the MOSFET 100 and the p-n junction device 102 can be seen schematically in FIG. 1. Initially, the output of the node 106 is at a relatively high voltage. When the photon impacts on the p-n device 102, this causes a relatively large current to flow rapidly which causes the voltage on node 106 to drop rapidly. As the quenching voltage is applied, the voltage at the node 106 rises back up to the initial voltage value. The voltage waveform at the node 106 is passed through an inverter 104 to give a square waveform with the low levels of the wave representing the state prior to the impact of the photon on the P-N device and after quenching, and the high level represents the impact of a photon. The output of the inverter 104 can be provided to detection circuitry to be processed. For example, the output of the inverter 104 can be input to a counter which counts every time the output of the inverter goes high.

It should be appreciated that the SPAD shown in FIG. 1 and the quenching arrangement is by way of example only and other structures may alternatively be used. For example, active quenching may be used. Other passive quenching arrangements may also be used.

In some embodiments, an array of SPADs is used. However, it should be appreciated that some embodiments may be used with a single SPAD.

A breakdown voltage is required to place the avalanche diode in the Geiger region of operation and cause the p-n device to operate as a SPAD. The breakdown voltage is controlled by the voltage differential across the p-n device rather than the absolute voltage values on either side of the reverse biased p-n junction device.

The breakdown voltage of the diode may be sensitive to one or more of the following factors: process variation, the SPAD design, variation in the components over time, and temperature variation.

In a SPAD provided on a chip, on a die, or as part of a chip set, this voltage provided to the SPAD may be provided by a voltage source on the same chip or die, or on another chip of the chip set or another die (packaged for example with the die having the SPAD). Alternatively, the voltage supply may be an external supply. If a SPAD is reverse biased with a voltage differential (controlled by the voltage supply) which is either too low or too high, the p-n device will not operate as a single photon sensitive avalanche diode.

In order to ensure correct operation of the SPAD taking into account one or more of the above factors, the voltage used should be calibrated. Various different factors may be considered in determining an optimum breakdown voltage for a particular SPAD or use of that SPAD. For example, in some scenarios, the optimum bias voltage may be considered to be the voltage at which the SPAD achieves its maximum count rate or best timing performance. Alternatively, in some embodiments, the optimum voltage may be considered to be the middle of the region of operation which may provide a compromise between two or more of the count rate, timing performance and dark count rate. The SPAD may be sensitive to thermally generated carriers which fire the avalanche process. The average number of counts per second when the SPAD is in complete darkness is referred to as the dark count rate and is a parameter which is used in defining the detector noise. The reciprocal of the dark count rate defines the average time that the SPAD will remain biased above breakdown before being triggered by an undesired thermal process. Usually, a SPAD is designed so as to remain biased above breakdown for a sufficiently long time in order to work correctly as a single photon detector.

As temperature conditions change, the breakdown voltage of the SPAD diode may drift. If the voltage provided by, for example, an on chip voltage source is fixed, then the breakdown voltage may be insufficient or too high for the SPAD to operate in the Geiger mode and have the effect as described previously.

In some embodiments, a SPAD arrangement may be required to operate over a wide range of temperature conditions. In some SPADs there may be an alteration in breakdown voltage of around 0.1V per 10 degrees centigrade. This may be significant in that in some cases the operation region of a SPAD may have an extent of 1 to 2 V between the lowest usable voltage and the highest usable voltage.

Figure 2:
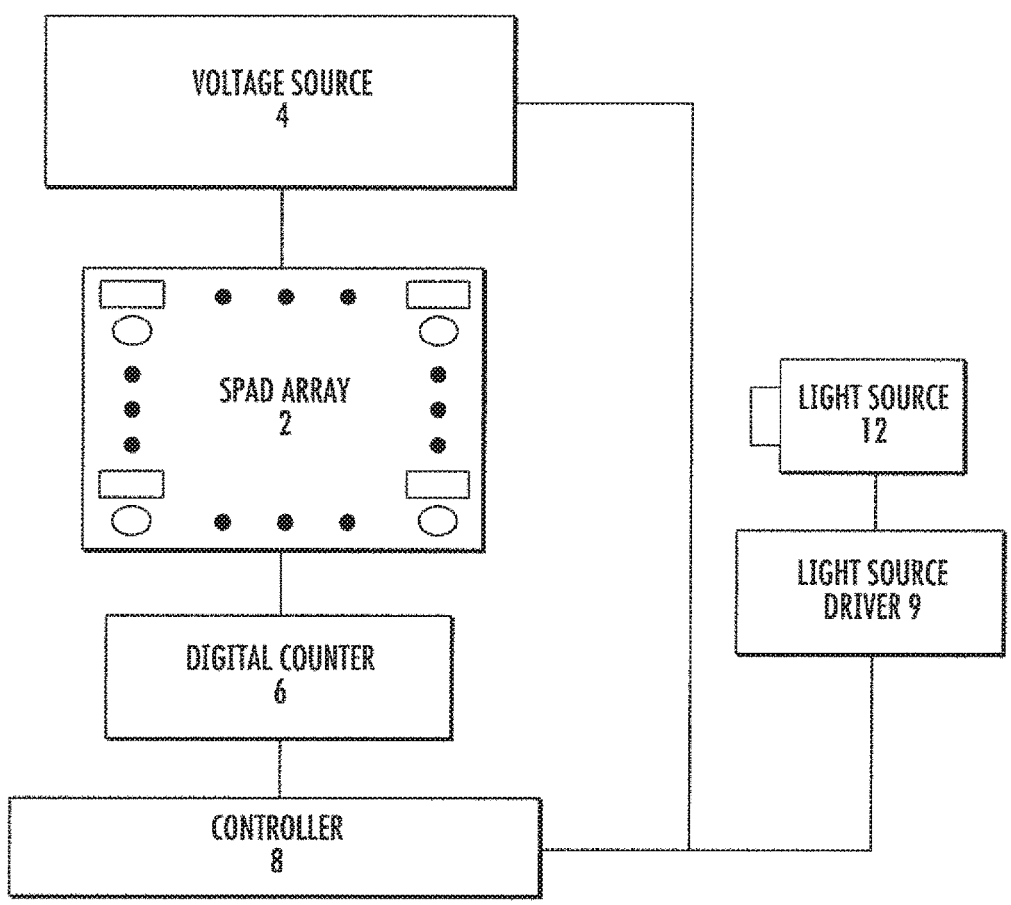
FIG. 2 shows a schematic diagram of the voltage control used in some embodiments.

Reference is made to FIG. 2 which shows one embodiment. The arrangement comprises a voltage source 4. This voltage source may provide, for example, $V_{EXCESS}$, as shown in FIG. 1. This voltage source may be an on chip voltage source, or the voltage source may be external to the chip. The voltage source may take any suitable format.

The voltage source 4 is configured to control the voltage applied to the SPAD array 2. In one embodiment, the voltage source may be used to control $V_{EXCESS}$ while $-V_{BREAKDOWN}$ is kept constant. Alternatively, $V_{EXCESS}$ may be kept constant and $-V_{BREAKDOWN}$ may be controlled by the voltage source. In some embodiments, both $-V_{BREAKDOWN}$ and $V_{EXCESS}$ may be varied.

In the following example, the voltage source will control $V_{EXCESS}$. The voltage source 4 provides the voltage which is used in each SPAD of the SPAD array 2. Each SPAD may be as shown in FIG. 1. The output of each SPAD is provided to a digital counter 6. In one embodiment, the digital counters 6 will count each time the output of the inverter 104 goes high, as shown in FIG. 1. The output of the digital counter 6 is input to a controller 8. The controller may take any suitable form and may be implemented by hardware, software and/or a combination of the two. In some embodiments, the controller 8 may comprise a firmware controller. In other embodiments, the controller 8 comprises at least one processor. The output of the controller 8 is used to provide an input to the voltage source 4. The input provided by the controller 8 controls the voltage which is provided by the voltage source 4.

The controller 8 is configured to put the arrangement of FIG. 2 into a calibration mode. When the arrangement is in a calibration mode, a control signal is provided by the controller 8 to a light source driver 9. In turn, the light source driver 9 will control a light source 12, switching it on or off. Where the device is part of a chip or the like, the light source 12 may be in the same package or a different package.

The controller 8 is configured to cause the voltage source to apply one or more different voltages to the array. In some embodiments, the controller 8 may be configured to control the voltage source to cycle through a plurality of output voltage values. The counts associated with each of the output calibration voltages are stored by the controller 8. Based on the results of the calibration, i.e. counts, the controller will select the appropriate voltage to be provided by the voltage source during the normal operation of the SPAD array.

It should be appreciated that this is just one example of one way in which the voltage can be calibrated. Other embodiments may use any other suitable method of calibration.

In some embodiments, the calibration cycle is carried out at defined time intervals. In some embodiments, the normal operation mode may be interspersed with calibration mode periods. In some embodiments, depending on the use of the SPAD arrangement, calibration may be performed when the SPAD is not required to be in a normal mode of operation. In alternative embodiments, the calibration cycle is controlled to take place alternatively or additionally in response to the determination of one or more conditions.

Figure 3:
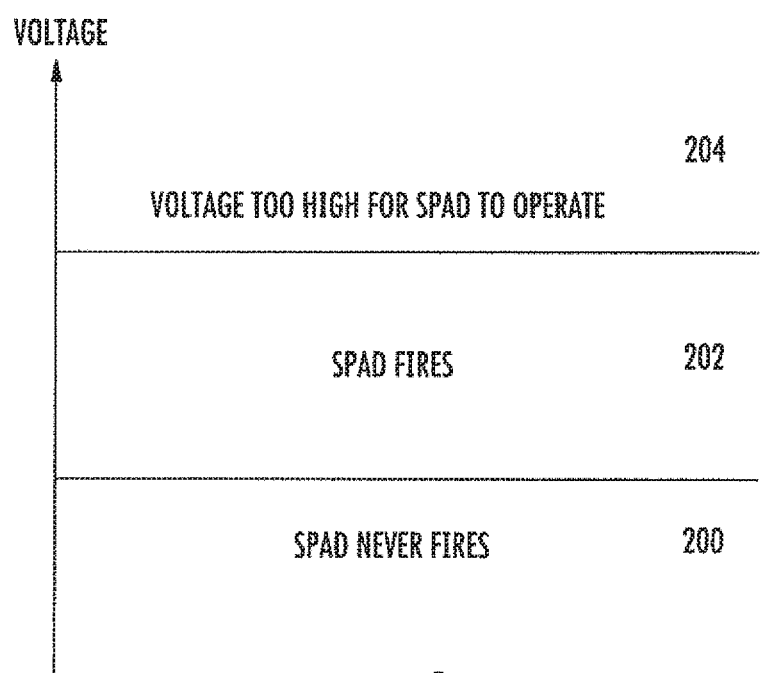
FIG. 3 shows schematically SPAD bias voltages and operating conditions.

Reference is made to FIG. 3 which shows a summary of SPAD bias voltage and operating conditions. The voltage of the y-axis of FIG. 3 represents a magnitude value rather than an absolute value. If the breakdown voltage, i.e., the voltage differential across the SPAD is insufficient, the SPAD never fires. This corresponds to reference 200. As the voltage increases, the SPAD enters its normal operating range. This corresponds to reference 202. In this region the energy release by the impact of a photon triggers the avalanche effect. As the voltage further increases, the voltage is too high for the SPAD to operate as required. This is region 204. The divisions between the regions may not be as clearly defined as shown in FIG. 3. Thus, in some embodiments, it may be desirable for the SPAD voltage to be such that that the SPAD operates well within the region 202 and not close to the border regions adjacent either region 200 or region 204. Region 202 may be considered to be the region in which the SPAD is the most photo responsive. Different embodiments may use different options for selecting the most appropriate voltage. It should be appreciated that in some embodiments, more than one voltage setting option may be available.

In one embodiment, the voltage setting that provides the maximum SPAD current rate can be selected. The voltage setting can be increased from a low voltage, i.e., below the breakdown of the voltage of the SPAD) until the breakdown voltage of the SPAD is established. The breakdown voltage of the SPAD 80 is determined when an appropriate count is detected by the digital counter. A fixed voltage offset or an increase can be applied so that that it is known how far beyond the breakdown voltage the bias has been set. It should be appreciated that embodiments can be used with any suitable method of calibrating the voltage.

The SPAD array used in different embodiments may have any suitable application. For example, some embodiments may be used in ranging applications for determining how far away an object is or for detecting the presence of an object within a given range or the like.

Figure 4:
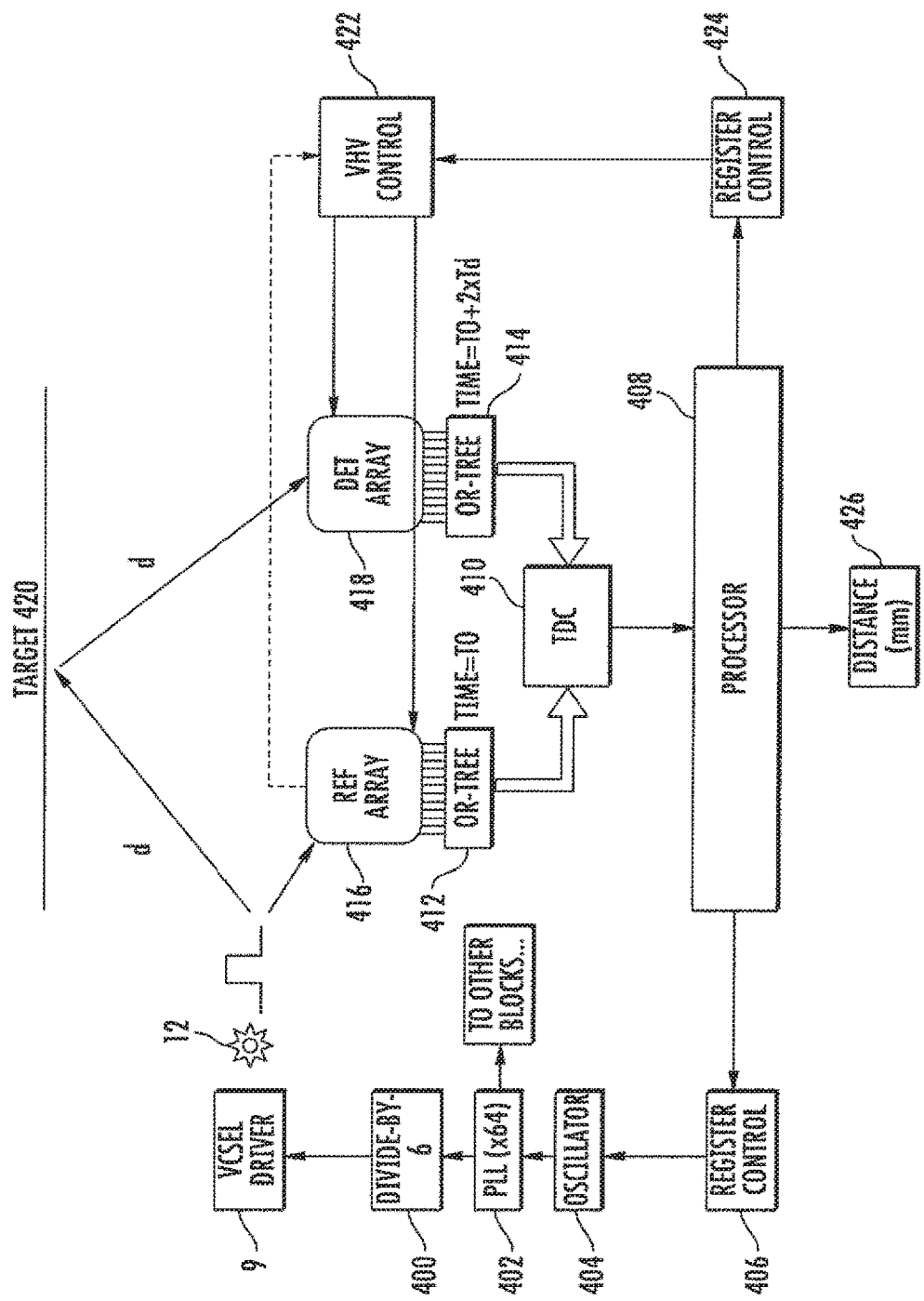
FIG. 4 shows a block diagram of one embodiment.

Reference is made to FIG. 4 which schematically shows an apparatus according to one embodiment. A laser diode 12 is controlled to emit a pulse of light, as indicated by reference d. The light d from the laser diode 12 is reflected from an object 420 and directed towards a detection array 418. The detection array comprises an array of SPADs, such as discussed previously. The light which is emitted from the laser diode is also received by a reference array 416, without being reflected by the target object. The outputs of the two arrays are provided to respective OR trees 412 and 414. In particular, the output of the reference array 416 is input to an OR tree array 412, the output of which is provided to a time to digital converter 410. The output of the detection array 418 is provided to the OR tree array 414, the output of which is again input to the time to digital converter 410. Thus, an OR tree is provided for each array. The OR tree function is to allow the outputs of the SPAD to be output in turn to the time to digital converter. Effectively, the input to the time to digital converter 410 from the OR tree 412 represents time $T_o$, i.e., the time at which the light pulse emitted by the laser diode is detected by the reference array. The output of the OR tree 414 provides the time equal to $T_o+2xT_d$. $T_d$ is the time taken for the pulse of light emitted by the laser diode to be emitted, reflected from the target and detected by the return array.

The output of the time to digital converter is input to a processor 408. The processor 408 is configured to provide an output 426 which represents the distance of the target from the device, i.e., d. The values of $T_o$ and $T_o+2xT_d$ are used to determine d in any suitable manner.

The processor is also configured to provide an output to a first register controller 406, the output of which is provided to an oscillator 404. The output of the processor controls the output of the register controller which in turn controls the frequency of the oscillator. In some embodiments, the output of the register controller is used to trim or adjust the oscillator frequency.

In some embodiments the first register controller may be provided by a look up table. The output of the processor provides the look up value, the output which controls the trim value which is used to control the frequency of the oscillator. This is described in more detail later.

The output of the oscillator 404 is used by a phase lock loop 402 which multiplies the clock signal by a factor. In this embodiment, the factor is 64. The output of the phase lock loop PLL 402 provides a clock or timing signal which is used by various other blocks. The output of the phase lock loop 402 is provided to a divider 400. In this example the divider 400 divides the frequency of the signal output by the PLL by a factor of 6. However, this is by way of example only and in other embodiments, the divider may be omitted or divided by another number. The signal which is output by the divider is a clock signal and is provided to the driver 9 for the laser diode 12. This is used to provide a drive signal which drives the laser diode.

The output of the processor 408 is provided to a second register controller 424, the output of which is provided to a voltage controller 422. The voltage controller 422 provides a control signal which is provided to the reference array 416 and to the return array 418 to thereby control the voltage applied across each SPAD.

In some embodiments, the control is swept repeatedly during device operation to ensure optimal SPAD firing conditions, compensating for process and temperature variations.

Any of the methods for voltage calibration previously described may be used. For example, the processor may be configured during calibration to control the voltage which is applied to the SPAD. In one embodiment, the voltage values are controlled to slowly increase until the SPADs begin to respond to incident value. The processor uses the values from the digital counter to determine which SPADs are firing. Once the processor finds the correct voltage (as the SPADs are firing), it will add a certain amount of bias to the voltage to ensure that the SPADs are operation within their operating range.

Figure 5:
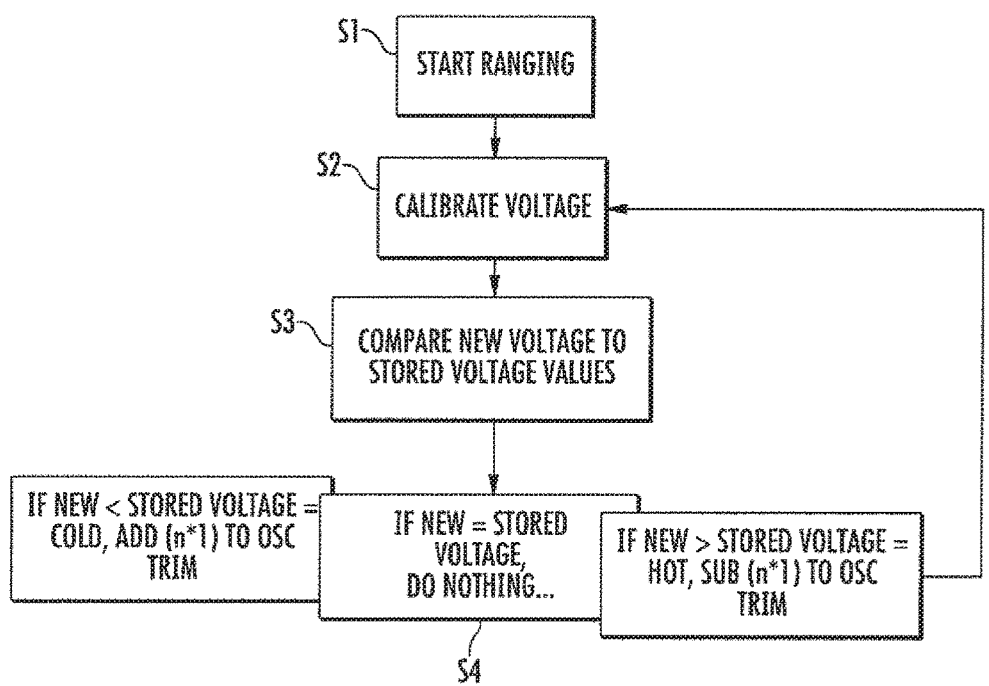
FIG. 5 shows a method of one embodiment.

Reference is made to FIG. 5 which is schematically shows a method of an embodiment. In step S1, the ranging operation is started to determine the distance of an object from the array. In other words, a light signal will be emitted by the laser diode and will be detected by the respective reference and the detector arrays. In some embodiments, this ranging operation is purely a test operation. In other embodiments, the ranging operation may be an actual operation.

In step S2, a calibration operation is performed such as outlined previously to determine a control value to be provided by the voltage controller 422 to control the SPAD voltage differential.

In step S3, the control value to be provided by the voltage controller is compared to the default value. In some embodiments, the default value may be stored in a non-volatile memory. The default value may be a value which is programmed at the time of manufacture for a given reference temperature RT. In some embodiments the RT is 23° C.

It should be appreciated that the control and reference values which are compared may be actual voltage values or values which are representative of the values. For example, the control and reference values may be represented by index values.

In step S4, any adjustment which is required is determined. In the embodiments, the adjustment may be to one or more of the oscillator frequency and the resultant distance reported to the user. Both the oscillator frequency and the distance reported to the user may be sensitive to variations in temperature. The voltage values which cause the SPADs to fire vary with temperature. For the typical temperature values over which the SPAD will operate (e.g. −20° C. to 60° C.) the voltage required to get the SPADs to fire will linearly increase with temperature. A comparison of the reference voltage control value and the determined voltage control value will give a measure of the temperature and the result can be used to compensate one or more of the oscillator frequency and the determined distance. This step may be performed in the processor.

If the new voltage control value is less than the reference voltage control value, then it can be determined that the temperature is colder than the temperature associated with the reference value. The size of the difference represents the magnitude of the difference from the reference temperature. This information is used to determine, for example, if the oscillator is to be trimmed and if so by how much.

If the new voltage control value is more than the reference voltage control value, then it can be determined that the temperature is hotter than the temperature associated with the reference value. Again, the size of the difference represents the magnitude of the difference from the reference temperature. This information is used to determine, for example, if the oscillator is to be trimmed and if so by how much.

If the new voltage control value is the same as the reference control value, then it can be determined that the temperature is the same or similar to the reference value and no adjustment is required.

As mentioned, this comparison is used to determine, for example, if the oscillator is to be trimmed and if so by how much. This is explained in more detail below.

Some embodiments are configured to adjust or trim the oscillator frequency to avoid interference. In particular, embodiments are configured to ensure that the harmonics of the oscillator frequency avoid one or more mobile telecommunication frequency bands. For example, in some embodiments, the oscillator frequency is controlled to avoid harmonics with one or more of the so-called 4G frequency bands and one or more GSM bands. For example, the frequency bands may be at one or more of 800 MHz, 1800 MHz and 2.6 GHz for 4G and 850 MHz and 900 MHz for GSM.

Figure 6:
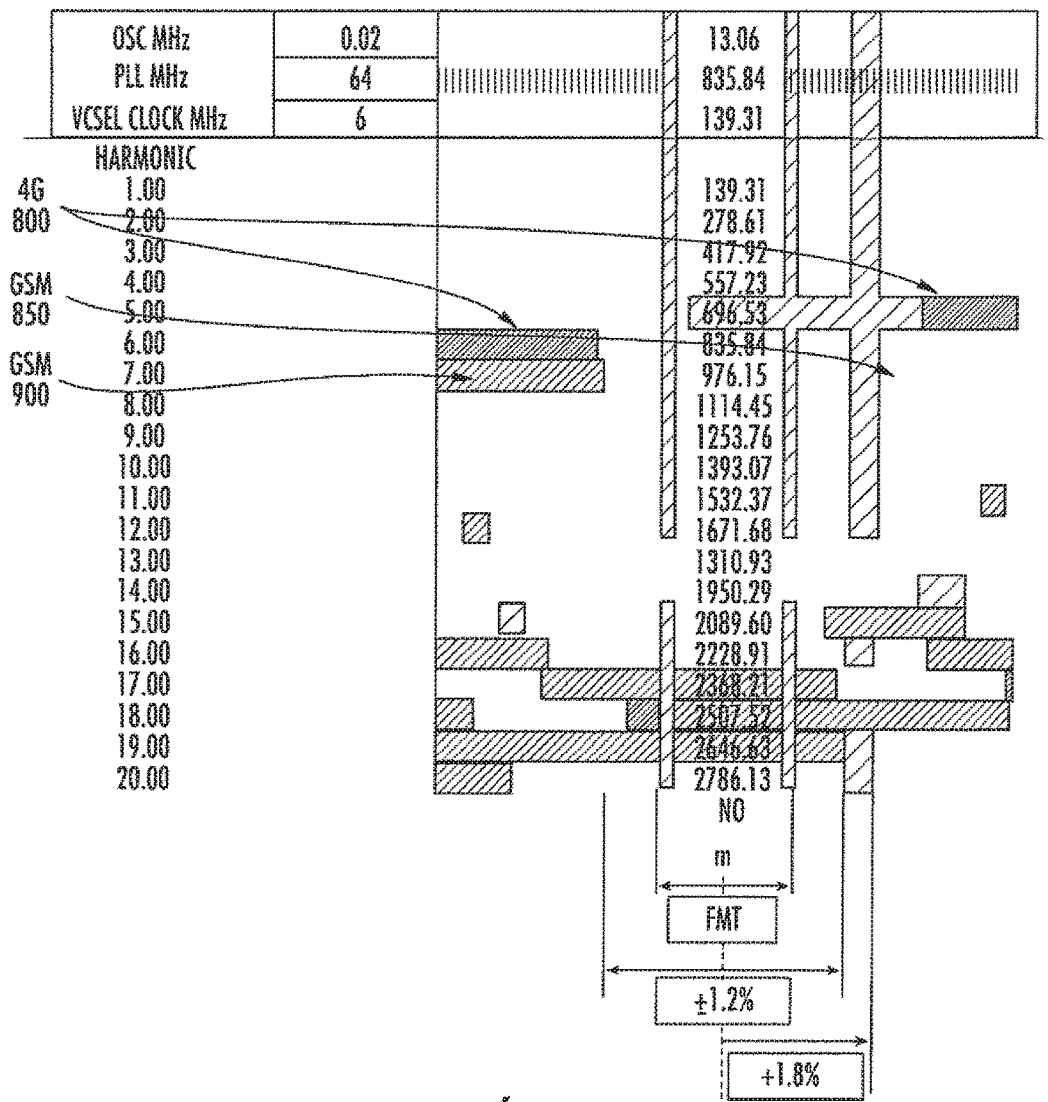
FIG. 6 schematically shows frequency harmonics of one embodiment and communication band frequencies.

In some embodiments, the frequency of the PLL may be 835.84 MHz and the driver clock frequency may be 139.31 MHz (1/6 of the PLL frequency). The oscillator frequency is 13.06 MHz (1/64 of the PLL frequency). The PLL frequency and the driver clock frequency are derived from the oscillator clock frequency. The harmonics of 139.31 MHz are shown in FIG. 6 along with the positions of the 4G band of 800 MHz, and the two GSM bands. When the oscillator, PLL and driver clock are operating at the correct frequencies, then there is no interference with the respective communication frequency bands. However, due to temperature changes, the frequency of the oscillator, PLL and driver clock may drift and potentially cause interference with the communication bands. Changes in the oscillator frequency will lead to changes in the PLL frequency and the driver clock frequency. Interference can arise from the PLL frequency and/or from the harmonics of the driver clock frequency.

In some embodiments, it is desirable to have a guard band between the frequency of harmonics/PLL frequency and the respective communications band. In one embodiment, a guard band of 40 kHz may be used. However, this is by way of example and in different embodiments, a different guard band value may be used. In the example shown, with a guard band of 40 KHz, this means that the oscillator or clock frequency needs to be in a window between 12.90 MHz to 13.26 MHz. It should be appreciated that these values are by way of example only and different embodiments may be arranged to be used with different device frequencies and/or to avoid one or more different frequency bands.

In some embodiments, the oscillator will be trimmed in order to keep the oscillator frequency in the above window. The oscillator is set as a default to operate at a reference temperature of 23° C. The default or reference temperature value is by way of example only and may be different in other embodiments. In some embodiments, the behavior of the oscillator may not be symmetric. For example, one third of the drift from the ideal frequency occurs when the temperature is lower than the reference temperature and two thirds of the drift from the ideal frequency occurs when the temperature is higher than the reference temperature. In other words, the drift from the ideal frequency is greater when the temperature is higher than the reference temperature as compared to when the temperature is lower than the reference temperature. Accordingly, in this example, the nominal frequency could be set to be 13.02 MHz in the case of the above example window. This allows for a lower drift of 0.65% (when the temperature falls below the reference temperature) and an upper drift of 1.57% (when the temperature rises above the reference temperature).

In some embodiments, the second register controller 424 is a look up table which is response to an output provides a control value which is used by the voltage controller to control the voltage differential across the SPADs. The control value may represent a compensation step value, an index associated with the required voltage value or an actual voltage value. The voltage is thus controlled in a stepwise fashion. In one example system, a SPAD device was tested over a range of temperatures from −10° C. to 60° C. and the voltage typically moved by 4 discrete steps. This was mapped to four corresponding oscillator trimming steps. For example, +1 trimming step, no trimming step, −1 trimming step and −2 trimming step. Because of the asymmetric behavior, the −2 trimming step may be replaced by a −3 trimming step. It should be appreciated that in other embodiments, there may not be a one to one mapping of steps. For example, the oscillator may be trimmed one step for every two steps of the voltage control.

The trimming step may be any suitable size and, for example, may be 70 kHz.

Thus some embodiments are configured to use the information relating to the change in the voltage differential applied to the SPADs as a measure of temperature and accordingly trim the oscillator to keep the oscillator frequency within the desired window, thus avoiding problems with harmonics and the PLL frequency interfering with communication band frequencies. In other embodiments, this technique may be used with any other parameter of the sensing device.

Thus, in some embodiments the voltage in the sensor itself can be used determine the temperature. The voltage of the SPAD may be determined by the sensor itself rather from a temperature sensor input. This may provide a relatively coarse resolution for temperature measurement, but in some applications, this may be enough to be used to compensate for the range drift calculation over temperature In other embodiments, an external temperature sensor is used for the temperature measurement. This may give a better temperature measurement and hence may provide a better input for the temperature compensation for the range output, for some applications.

Figure 7:
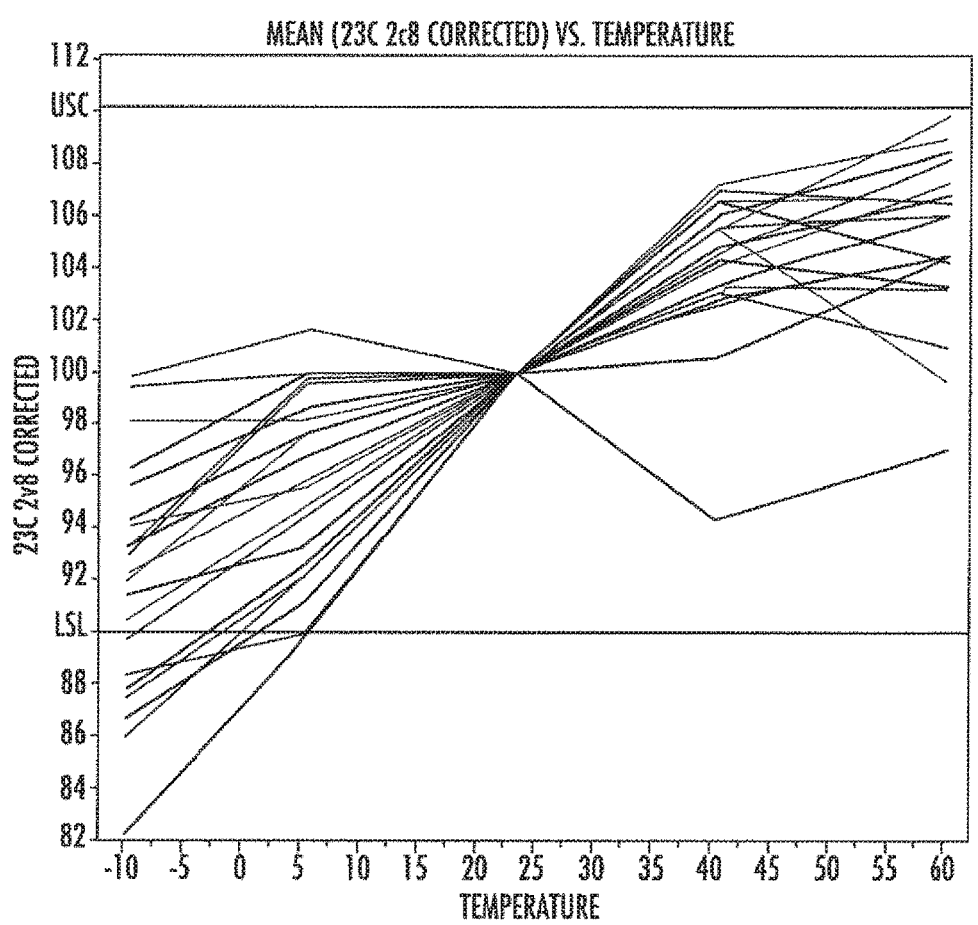
FIG. 7 shows a first graph of ranging results for a set of devices.

Reference is made to FIG. 7 which schematically shows a graph of determined range distance versus temperature for a number of devices. The actual range distance is a constant value of 100 mm. The data is normalized for the reference temperature of 23° C. As can be seen the determined range distance is dependent on temperature. The reference temperature may have any other suitable value in embodiments.

In one embodiment, the gradient of the voltage with respect to the determined range may be used. This may be found by determining a series of range measurements at the reference temperature of 23° C., and recording the associated voltage control value VHV. This may be done for a number of different devices.

Gradient of VHV to range=x. In one embodiment, x is 0.82. Correction that needs to be applied=−1/x (and where x is 0.82, the correction is=−1.2.).

In the embodiments, a correction algorithm is applied to the raw range value: New range=Initial range value +1/x* (reference VHV value−actual VHV value)

In some embodiments, the reference VHV value could be obtained by reading the value from memory or form other stored values. The respective value may be programmed at manufacture, for example. For example, a value representative of the maximum VHV range value may be obtained and this may be reduced by a given value or a value representative of the minimum VHV range value may be obtained and this may be increased by a given value. These may be values programmed in the device at production and correspond to the boundaries of the region 202 shown in FIG. 4.

Figure 8:
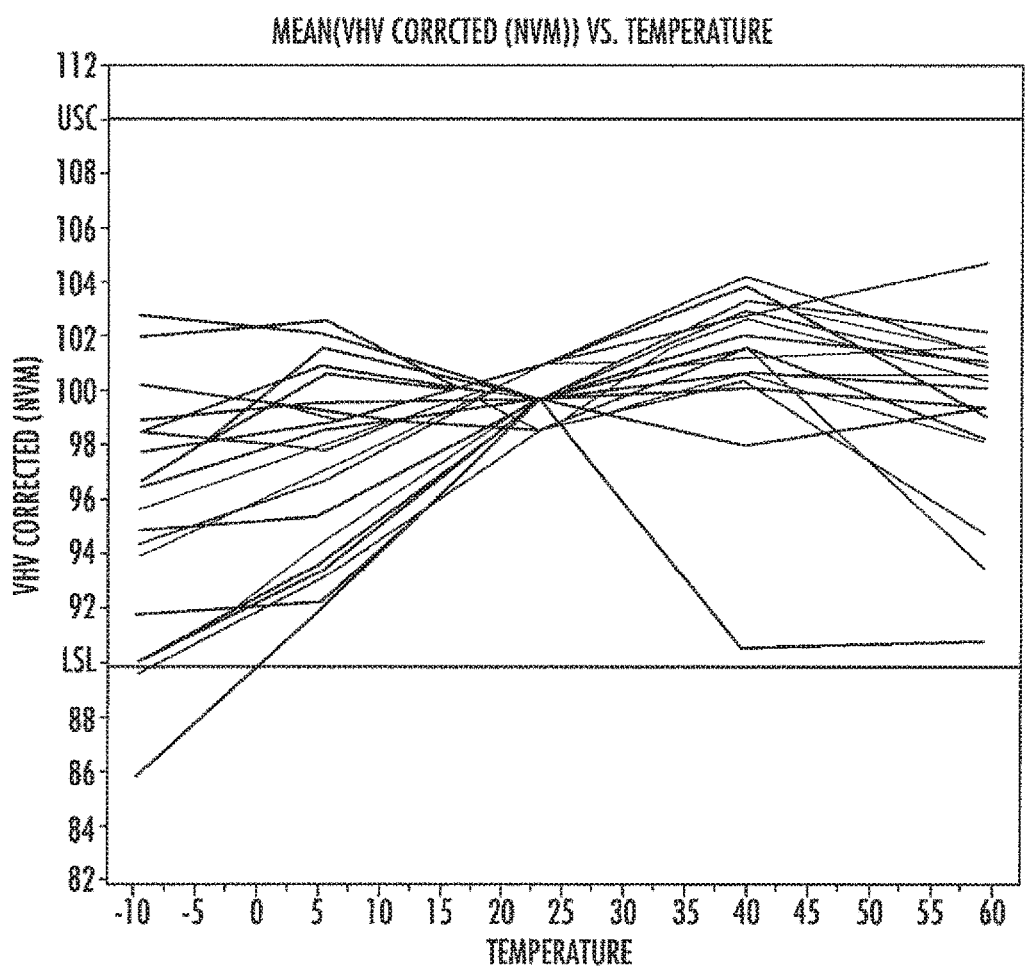
FIG. 8 shows a second graph of ranging results for the set of devices to which a first compensation method has been applied.

Reference is made to FIG. 8, which shows the data of FIG. 7 which has been corrected using the above equation. As can be seen, there is a smaller deviation between the measured range and the actual range (again 100 mm) over a wider range of temperatures.

In another embodiment the following correction algorithm is applied. Instead of applying −1/x factor to VHV, the following is applied For temperature≥RT (Determined by seeing if the actual VHV≥reference value. The reference value may be as discussed previously):

New range=Raw Range+1/x*(reference value−actual VHV)

For temperature<RT (determined by seeing if the actual VHV<reference value)

New range=Raw Range+y*(reference value−actual VHV)

In one embodiment y is 3. It should be appreciated the values 1/x and y can be tuned for different products.

This latter correction algorithm is thus able to take into account the case that range drift at lower temperatures may be more severe than at higher temperature. In some embodiments, the value of 1/x and y are selected such that the new range value will be within a given tolerance band about the actual value over a given temperature range. The temperature range may be any suitable range such as −10° C. to 6° C.

Figure 9:
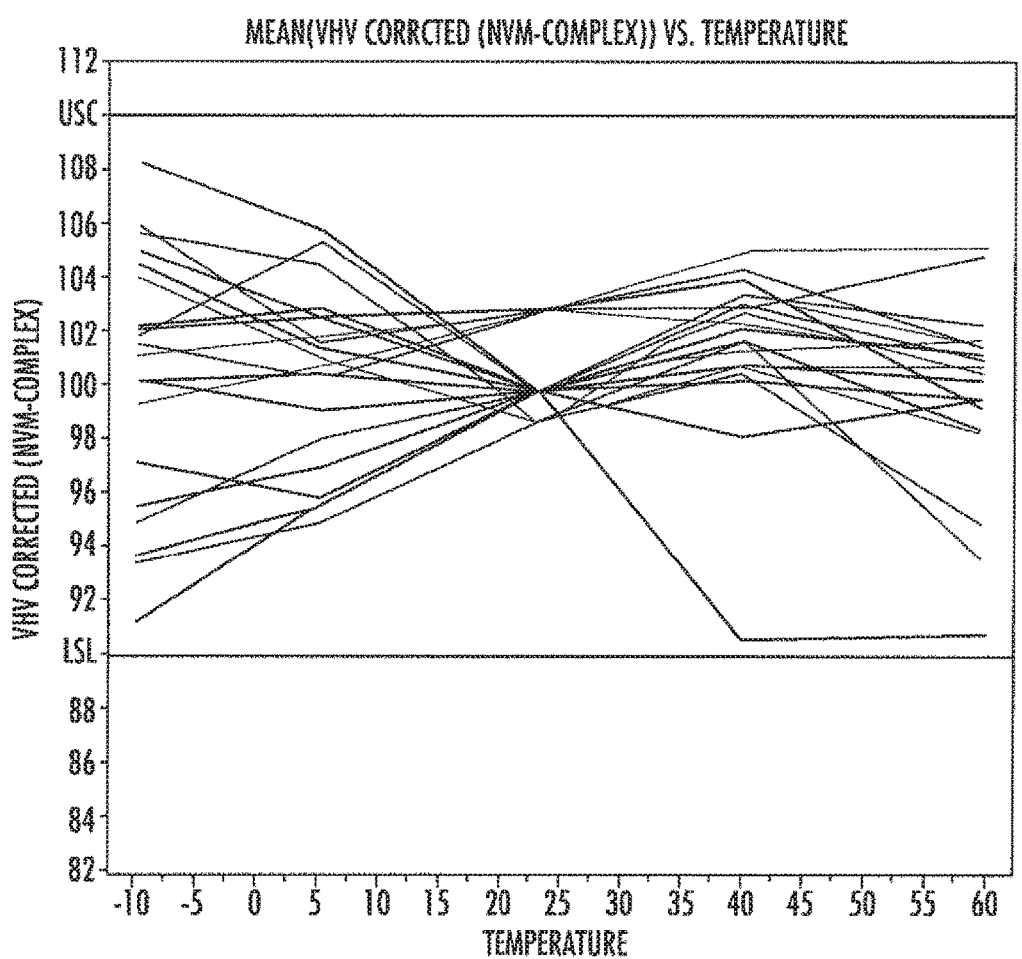
FIG. 9 shows a third graph of ranging results for the set of devices to which a second compensation method has been applied.

Reference is made to FIG. 9 which show the data of FIG. 7 which has been corrected using the more complex correction algorithm. As can be seen, the range determined at lower temperatures is more accurate than that determined using the less complex algorithm.

Note the range drift may be a fixed offset that occurs at all distances, hence it cover the full operation range of the sensor.

The correction values are specific to the sensor used and different values may be required by different products. In general, range drift occurs with temperature changes. This can be regarded as a fixed and known drift and since the temperature can be measured directly or indirectly, then range drift can be corrected or compensated.

Some embodiments may use other sensors, instead of SPADs. These sensors may be integrating elements, rapid charge transfer photodiodes or any other suitable device which generates events on reception of the light information.

It should be appreciated that the above described arrangements may be implemented at least partially by an integrated circuit, a chip set, one or more dies packaged together or in different packages, discrete circuitry or any combination of these options.

It should be appreciated, that an application of some embodiments in a ranging device has been described. However, it should be appreciated that this is only one example of an application of many different embodiments. Other embodiments may be used with any other application of a SPAD or SPAD array or any other suitable photo sensitive device or photo sensitive device array.

Figure 10:
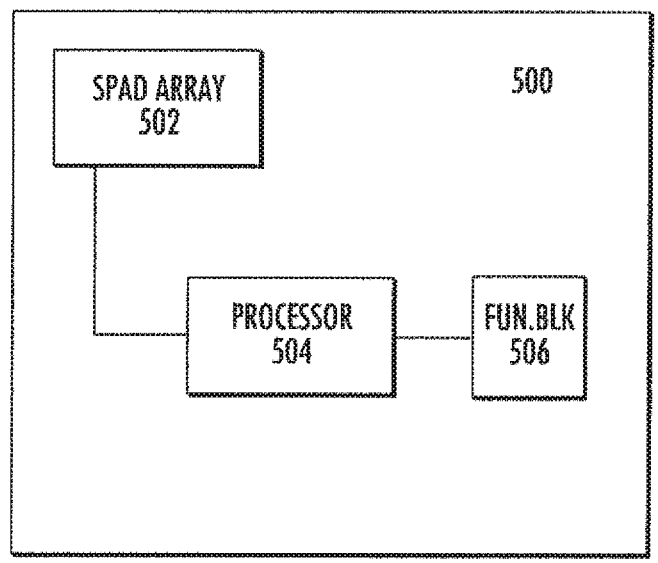
FIG. 10 shows a device having a SPAD arrangement.

Some embodiments may be provided in a device 500 such as shown in FIG. 10. The device 500 may comprise any one of the SPAD or the like arrangements as previously described and referenced 502. An output from the SPAD arrangement may be provided to the processor 504. Based on the output provided by the processor an information or control signal may be output to function block 506. The function block may be a controller which is configured to cause one or more actions in response to detecting a presence of an object. The function block may be a display which is configured to display a measurement result.

It should be appreciated that the device may be any suitable device. By way of example only and without limitation, the device may be a mobile telephone, smart phone, tablet, computer, measuring device, switch controller such as for a light, controlling a water supply such as in a tap or toilet, door controller, distance sensor, impact controller, or any other suitable device.

Various embodiments with different variations have been described above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A device comprising:
   a single photon avalanche detector (SPAD);
   a voltage regulator coupled to the SPAD;
   a counter having an input coupled to an output of the SPAD; and
   a controller configured to perform a calibration test by:
      modifying a voltage across the SPAD by controlling the voltage regulator to cycle through a plurality of output voltages;
      determining, with the counter, a plurality of counts, wherein each count of the plurality of counts is associated with a respective voltage of the plurality of output voltages;
      selecting a first voltage of the plurality of output voltages based on the plurality of counts;
      compare the first voltage with a reference voltage; and
      determining a temperature drift based on the comparison.

2. The device of claim 1, further comprising an oscillator, wherein the controller is further configured to, during the calibration test, adjust a frequency of the oscillator based on the temperature drift.

3. The device of claim 2, wherein the controller is configured to adjust the frequency of the oscillator by using a look up table.

4. The device of claim 1, further comprising a non-volatile memory, wherein a value associated with the reference voltage is stored in the non-volatile memory.

5. The device of claim 1, wherein the SPAD comprises:
   a p-n junction coupled between a first supply node and a first node;
   a transistor coupled between a second supply node and the first node; and
   an inverter coupled between the first node and the output of the SPAD.

6. The device of claim 5, wherein the voltage regulator is coupled to the first supply node.

7. The device of claim 5, wherein the voltage regulator is coupled to the second supply node.

8. The device of claim 1, further comprising a plurality of SPADs, wherein the plurality of SPADs comprises the SPAD, and wherein the plurality of SPADs are coupled to the counter via an OR-TREE.

9. The device of claim 1, wherein the controller is configured to perform the calibration test at predetermined time intervals.

10. The device of claim 1, further comprising a light source driver configured to control a light source, wherein the controller is further configured to control the light source driver during the calibration test.

11. The device of claim 1, wherein:
   modifying the voltage across the SPAD comprises increasing the voltage across the SPAD; and
   selecting the first voltage comprises determining a second voltage at which the SPAD is firing, wherein the first voltage is equal to the second voltage plus a predetermined voltage.

12. A method comprising:
   cycling through a plurality of voltage across a single photon avalanche detector (SPAD);
   determining, with a counter coupled to the SPAD, a plurality of counts, wherein each count of the plurality of counts is associated with a respective voltage of the plurality of voltages;
   selecting a first voltage of the plurality of voltages based on the plurality of counts;
   comparing the first voltage with a reference voltage; and
   determining a temperature drift based on the comparison.

13. The method of claim 12, further comprising adjusting a frequency of an oscillator based on the temperature drift.

14. The method of claim 13, wherein adjusting the frequency of the oscillator comprises using a look up table.

15. The method of claim 13, wherein adjusting the frequency of the oscillator comprises adjusting the frequency of the oscillator to avoid harmonics with one or more 4G frequency bands.

16. The method of claim 12, further comprising storing the reference voltage into non-volatile memory.

17. The method of claim 12, wherein:
   cycling through the plurality of voltages comprises increasing the voltage across the SPAD; and selecting the first voltage comprises determining a second voltage at which the SPAD is firing, wherein the first voltage is equal to the second voltage plus a predetermined voltage.

18. The method of claim 12, further comprises determining a distance to an object by determining a first distance, wherein the distance to the object is equal to the first distance plus 1/x times (the reference voltage minus the first voltage), wherein x is a predetermined constant.

19. The method of claim 18, wherein the distance to the object is equal to the first distance plus 1/x times (the reference voltage minus the first voltage) when a current temperature is greater than or equal to a predetermined threshold, and wherein the distance to the object is equal to the first distance plus 1/y times (the reference voltage minus the first voltage) when a current temperature is lower than the predetermined threshold, wherein y is a predetermined constant.

20. The method of claim 19, wherein y is greater than x.

21. A device comprising:
   means for cycling through a plurality of voltage across means for sensing light;
   means for determining a plurality of counts received from the means for sensing light, wherein each count of the plurality of counts is associated with a respective voltage of the plurality of voltages;
   means for selecting a first voltage of the plurality of voltages based on the plurality of counts;
   means for comparing the first voltage with a reference voltage; and
   means for determining a temperature drift based on the comparison.

* * * * *